(12) United States Patent
Rahman et al.

(10) Patent No.: US 7,541,884 B2
(45) Date of Patent: Jun. 2, 2009

(54) METHODS AND APPARATUS FOR CRYSTAL OSCILLATOR DRIFT ESTIMATION AND COMPENSATION

(75) Inventors: Mohammad A. Rahman, Allen, TX (US); Umashankar S. Iyer, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/932,258

(22) Filed: Oct. 31, 2007

(65) Prior Publication Data

US 2008/0273645 A1 Nov. 6, 2008

Related U.S. Application Data

(60) Provisional application No. 60/915,863, filed on May 3, 2007.

(51) Int. Cl.
*H03L 1/02* (2006.01)
*H04B 1/06* (2006.01)
*H04L 7/00* (2006.01)
*H04L 27/06* (2006.01)

(52) U.S. Cl. .................. 331/176; 375/344; 375/354; 455/257

(58) Field of Classification Search .............. 331/65, 331/66, 68, 69, 158, 159, 175, 176; 375/344, 375/354; 455/255, 257
See application file for complete search history.

(56) References Cited

U.S. PATENT DOCUMENTS

2004/0001539 A1* 1/2004 Sankaran et al. ............ 375/231

* cited by examiner

*Primary Examiner*—David Mis
(74) *Attorney, Agent, or Firm*—Ronald O. Neerings; Wade James Brady, III; Frederick J. Telecky, Jr.

(57) ABSTRACT

In at least some disclosed embodiments, a method includes receiving a burst of data out of multiple bursts of data subject to long-term frequency drift and short-term frequency drift, determining an intercept of the long-term frequency drift based on, at most, the entire burst, and compensating for the long-term drift of a subsequent burst based on the intercept. The method further includes determining a slope of the short-term frequency drift, and compensating for the short-term frequency drift of a subsequent burst based on the slope.

25 Claims, 3 Drawing Sheets

US 7,541,884 B2

METHODS AND APPARATUS FOR CRYSTAL OSCILLATOR DRIFT ESTIMATION AND COMPENSATION

CROSS-REFERENCE TO RELATED APPLICATIONS

The present application claims priority to U.S. Ser. No. 60/915,863, filed on May 3, 2007, which is herein incorporated by reference.

BACKGROUND

Low-cost digital television ("DTV") receivers for handheld devices use crystal oscillators as a clock source. The crystal oscillators are not temperature compensated. DTV receivers also use a demodulator chip that increases and decreases in temperature as the receiver receives video data in bursts, each burst of data representing one time slice during time slice mode of operation. The increase in temperature causes the crystal oscillator frequency to shift, or "drift," in one direction, and the decrease in temperature causes the frequency to drift in the other direction.

FIG. 1 illustrates the drift using frequency offset updates, i.e., the difference of the frequency while receiving bursts and a reference frequency plotted over time. The drift illustrated in FIG. 1 is termed "short-term drift." For example, note how the frequency drifts from −30 Hz to 0 Hz and drifts back to −30 Hz near the time of $1.1 \times 10^4$ ms in FIG. 1.

The short-term drift itself is subject to an overarching "long-term drift" as seen in FIG. 2, which illustrates frequency offsets over a longer period of time. For example, note how the short-term drift oscillations center around 0 Hz at $3 \times 10^4$ ms, but center around 40 Hz at $8 \times 10^4$ ms. Both short-term drift and long-term drift cause degraded performance in the DTV receiver. Also, the drifts can cause the DTV receiver to lose synchronization with the transmitter.

SUMMARY

Methods and devices for increasing receiver performance by decreasing short-term and long-term drift are described herein. In at least some embodiments, a method includes receiving a burst of data out of multiple bursts of data subject to long-term and short-term frequency drift, determining an intercept of the frequency drift based on, at most, the entire burst, and compensating for the long-term drift of a subsequent burst based on the intercept.

In other disclosed embodiments, a computer-readable medium stores a software program that, when executed by a processor, causes the processor to receive a burst of data out of multiple bursts of data subject to long-term and short-term frequency drift, determine an intercept of the frequency drift based on, at most, the entire burst, and compensate for the long-term drift of a subsequent burst based on the intercept.

In yet other disclosed embodiments, a mobile device includes a frequency offset computation module, a drift estimation module, and a frequency error correction module. The frequency offset computation module is configured to receive multiple bursts of data, create multiple samples for each burst, determine one frequency offset per sample, and forward samples and offsets to the frequency drift estimation module. The frequency drift estimation module is configured to receive samples and the offsets from the frequency offset computation module and determine an intercept and slope of the frequency drift based on the samples and the offsets corresponding to at most one burst. The frequency error correction module is configured to compensate for the long-term drift of the subsequent burst based on the intercept and compensate for the short-term drift of the subsequent burst based on the slope.

These and other features and advantages will be more clearly understood from the following detailed description taken in conjunction with the accompanying drawings and claims.

BRIEF DESCRIPTION OF THE DRAWINGS

For a more complete understanding of the present disclosure, reference is now made to the accompanying drawings and detailed description, wherein like reference numerals represent like parts.

NOTATION AND NOMENCLATURE

Certain terms are used throughout the following claims and discussion to refer to particular components. This document does not intend to distinguish between components that differ in name but not function. In the following discussion and in the claims, the terms "including" and "comprising" are used in an open-ended fashion, and thus should be interpreted to mean "including but not limited to." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. The discussion of any embodiment is meant only to be illustrative of that embodiment, and not intended to intimate that the scope of the disclosure, including the claims, is limited to that embodiment.

Figure 1:
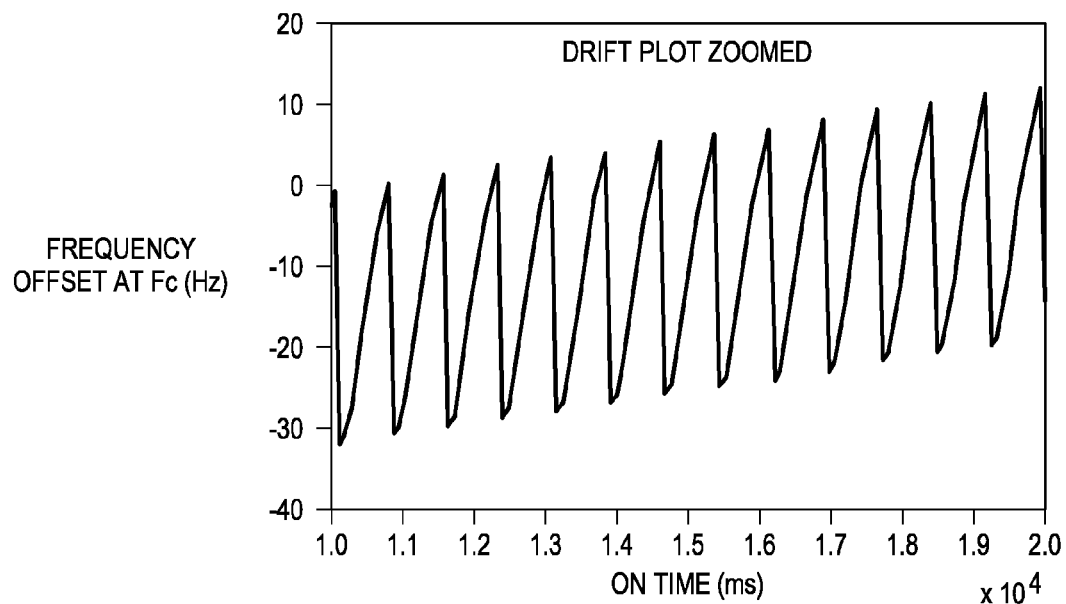
FIG. 1 illustrates short-term frequency drift in accordance with at least some illustrative embodiments.
Figure 2:
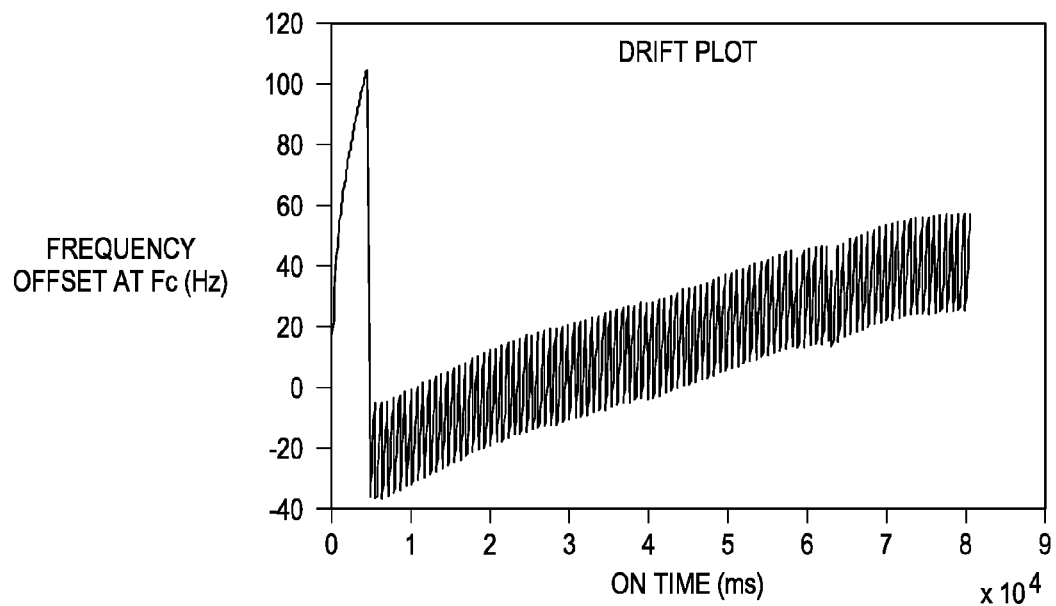
FIG. 2 illustrates long-term frequency drift in accordance with at least some illustrative embodiments.
Figure 3:
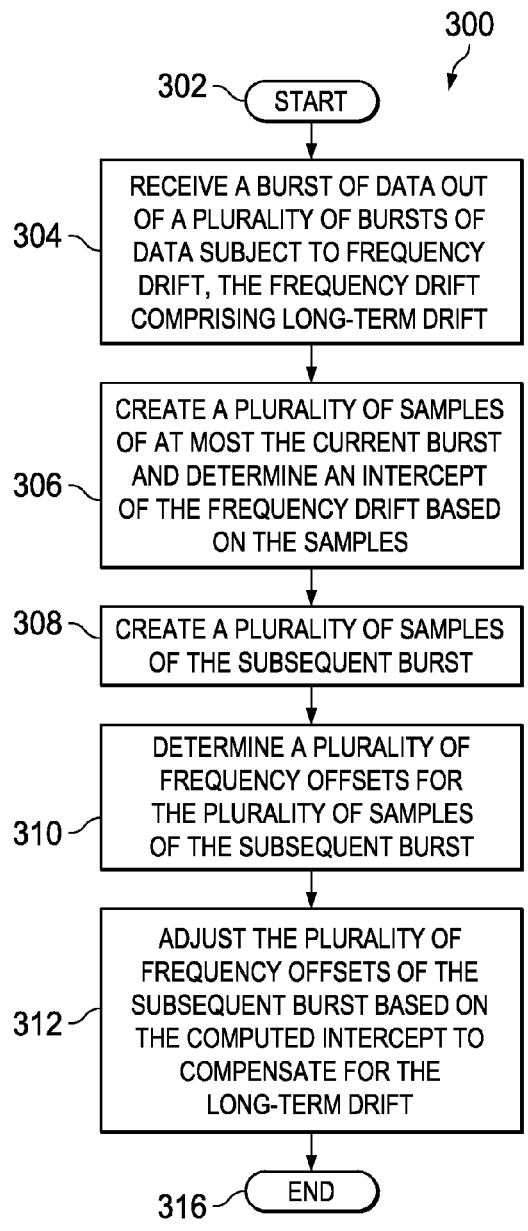
FIG. 3 illustrates a method for estimating and compensating for long-term drift in accordance with at least some illustrative embodiments.

FIG. 3 is a flow chart illustrating a method 300 of estimating and compensating for long-term drift, beginning at 302 and ending at 316. At 304, a burst of data out of a plurality of bursts of data is received. Preferably, the plurality of bursts make up a DTV signal, but in at least some embodiments, the plurality of bursts make up any type of signal. The bursts of data are subject to long-term drift, as mentioned above. At

306, a Y-axis intercept ("intercept") of the frequency drift is determined based on, at most, the entire burst. The intercept is the frequency value at which the drift is estimated to cross the Y-axis on a graph illustrating frequency over time, and the intercept can be used as an estimate of the long-term drift. In at least some embodiments, the intercept may be determined based on less than the burst, but should not be determined based on more than the burst.

In order to determine the intercept $a_j$, the burst is preferably sampled. The number of samples per burst should be optimized for best estimation of drift. If j denotes the current burst number, creating the samples is mathematically represented as the vector $$t_j = [t_1^j, t_2^j, \ldots, t_M^j], \tag{1}$$

where $t_j$ represents the time vector of jth burst, M is the number of samples created, and each t represents sample time. Next, multiple frequency offsets $f_j$ are determined, one for each sample:

$$f_j = [f_1^j, f_2^j, \ldots, f_M^j]. \tag{2}$$

Here $f_j$ represents the frequency offset vector. Next, the slope of the frequency drift $b_j$ is determined. Preferably the slope is determined using linear regression analysis. The slope can be estimated as $$b_j = \frac{SS_{tf} - S_t S_f}{SS_{tt} - S_t^2}, \tag{3}$$

wherein $$S = \sum_{i=1}^{M} 1 = M, \tag{4}$$

$$S_t = \sum_{i=1}^{M} t_i, \tag{5}$$

$$S_f = \sum_{i=1}^{M} f_i, \tag{6}$$

$$S_{tt} = \sum_{i=1}^{M} t_i^2, \text{ and} \tag{7}$$

$$S_{tf} = \sum_{i=1}^{M} t_i f_i. \tag{8}$$

In at least some embodiments, regression analysis of a higher order is used (e.g. 2nd order or higher). Finally, the intercept $a_j$ is determined; preferably, $$a_j = \frac{S_f - b_j S_t}{M}. \tag{9}$$

At 308 and 310, a subsequent burst is sampled and frequency offsets are determined for each sample, preferably creating offsets $f_{j+1}$ in the manner of $f_j$ (Eq. 2). Preferably, the subsequent burst is the very next burst. In at least some embodiments, the subsequent burst is not the very next burst, rather any subsequent burst. At 312, the plurality of frequency offsets of the subsequent burst are adjusted based on the determined intercept to compensate for the long-term drift; preferably, the frequency offsets of the subsequent burst is reduced by the intercept resulting in the difference $d_{j+1}$:

$$d_{j+1} = f_{j+1} - a_j. \tag{10}$$

Preferably, the frequency offsets for each subsequent burst is reduced by the intercept determined based on the burst just before each subsequent burst such that the long-term drift over the entire signal is eliminated.

Because this method 300 uses samples from, at most, one burst, discontinuity of the long-term frequency offsets due to temperature variation from burst to burst does not impact performance. Also, the estimation of long-term drift is more accurate when compared with estimations that use frequency offsets from multiple bursts. Indeed, if the drift is not estimated and compensated for accurately, synchronization with the transmitter is ultimately lost.

Figure 4:
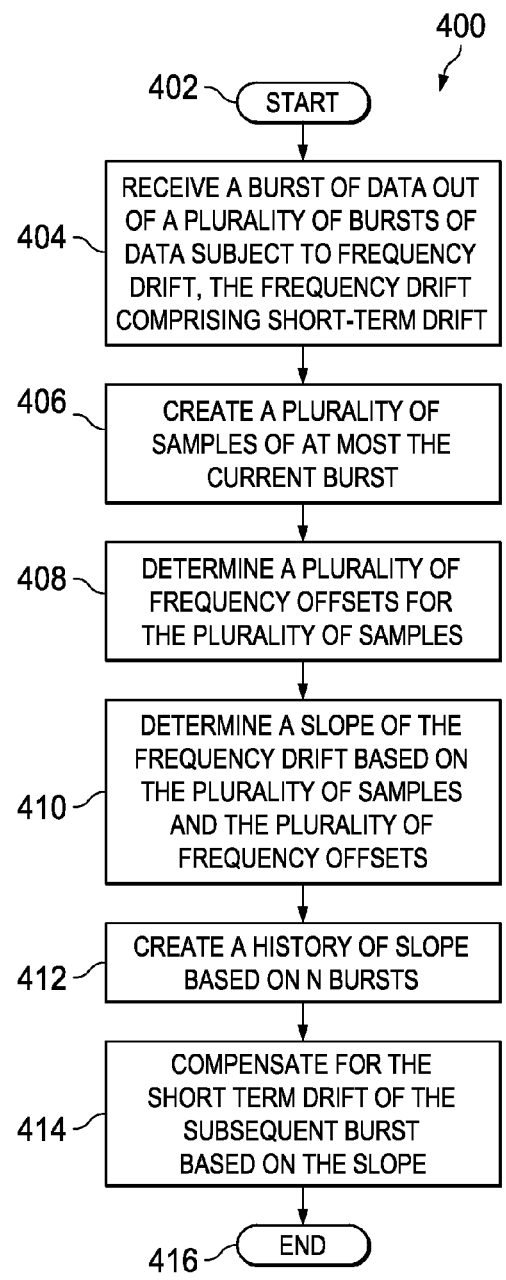
FIG. 4 illustrates a method for estimating and compensating for short-term drift in accordance with at least some illustrative embodiments.

FIG. 4 is a flow chart illustrating a method 400 of estimating and compensating for short-term drift, beginning at 402 and ending at 416. At 404, a burst of data out of a plurality of bursts of data, which preferably make up a digital television signal, is received. The burst is subject to short term drift. Similar to the method 300 above, a slope of the frequency drift $b_j$ (Eq. 3) is determined at 406, 408, and 410. Preferably, slopes are calculated for N−1 previously received bursts as well, and a history of the slopes based on the last N−1 bursts and current burst is created at 412. Using the multiple slopes, and preferably the history of the slopes, the average drift slope $b'_j$ is determined. Instead of average drift slope a weighted average or any other filtering techniques can also be applied. The average slope is, of course, also based on the slope determined from the current burst $b_j$. Mathematically, the average slope can be represented as $$b'_j = \frac{b_j + b_{j-1} + \ldots + b_{j-N-1}}{N}. \tag{11}$$

As can be deduced from (Eq. 11), if only the slope determined from the current burst is used, then $b'_j = b_j$. At 414, in at least some embodiments, the short-term drift is compensated for based on the average slope using $d_{j+1}$ (Eq. 10) and $b'_j$ in the equation $$e_{j+1} = [d_1^{j+1} - b'_j, d_2^{j+1} - 2b'_j, \ldots, d_M^{j+1} - Mb'_j]. \tag{12}$$

Figure 5:
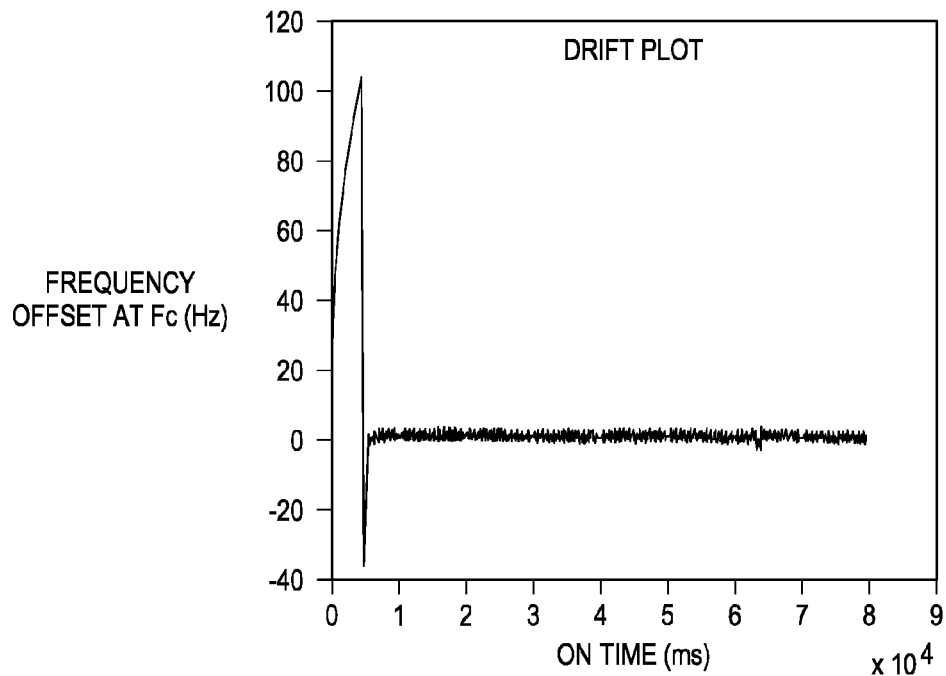
FIG. 5 illustrates the absence of frequency drift after compensation in accordance with at least some illustrative embodiments.

When compensating for either short-term, long-term drift, or both 300, 400, the variables t, N, and M should be adjusted so that drift compensation is optimized. Also, those having ordinary skill in the art would recognize that the methods 300, 400 are not limited to DTV signals. For data subject to both long-term drift and short-term drift, the methods 300, 400 can be performed concurrently. If the methods 300, 400 are performed concurrently, both long-term drift and short-term drift will be eliminated, as seen in FIG. 5. Eliminating the drifts by repeating the methods 300, 400, for each burst allows for receiver performance to improve. Preferably the user experiences the improved performance by being provided a data stream, in the form of video if used for DTV signals, based at least in part on the burst or subsequent burst.

Figure 6:
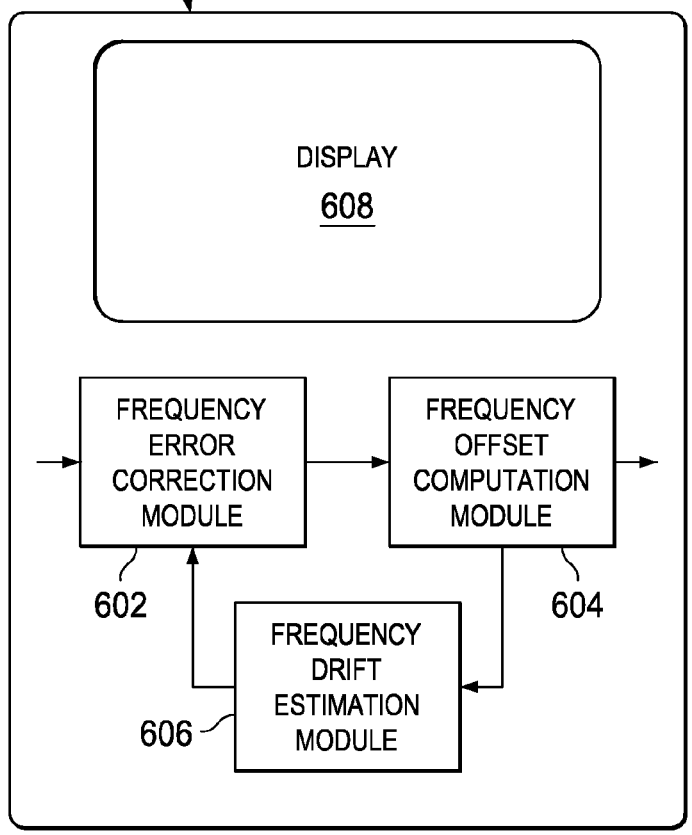
FIG. 6 illustrates a mobile device configured to compensate for short-term and long-term frequency drift in accordance with at least some illustrative embodiments.

FIG. 6 is a block diagram illustrating a mobile device 600 configured to compensate short-term and long-term frequency drift by implementing at least some of the steps of the methods described above 300, 400. The mobile device 600 includes a frequency error correction module 602, a frequency offset computation module 604 coupled to the frequency error correction module 602, and a frequency drift estimation module 606 coupled to the frequency error correction module 602 and the frequency offset computation module 604.

The frequency error correction module 602 is configured to forward the burst to the frequency offset computation module 604. The frequency offset computation module 604 is configured to receive the burst of data from the frequency error correction module 602. The frequency offset computation module 604 is also configured to create multiple samples for the burst (Eq. 1), determine one frequency offset per sample (Eq. 2), and forward the samples and the offsets to the frequency drift estimation module 606. Preferably, the frequency offset computation module 604 is configured to create samples and offsets for each burst it receives.

The frequency drift estimation module 606 is configured to receive the samples and the offsets from the frequency offset computation module 604, and determine an intercept of the frequency drift based on the samples and the offsets corresponding to, at most, the burst. In order to determine the intercept, the frequency drift estimation module 606 is configured to determine a product of the slope of the frequency drift based on the burst (Eq. 3) and the sum of the plurality of samples (Eq. 5), determine a difference of the sum of the plurality of frequency offsets and the product, and divide the difference by the number of samples in the plurality of samples (Eq. 9).

The frequency error correction module 602 is configured to determine the difference of the offsets corresponding to a subsequent burst (also provided by the frequency offset computation module 604) and the intercept (Eq. 10). By subtracting out the intercept from the offsets of the subsequent burst, the frequency error correction module 602 is compensating for the long-term drift of the subsequent burst. The frequency error correction module 602 can compensate for the long-term drift for the entire signal by iterating the technique for every subsequent burst.

If the burst is subject to short-term drift, the frequency drift estimation module 606 is further configured to determine the slope of the frequency drift for each previous N−1 bursts based on linear regression analysis. In at least some embodiments, regression analysis of a higher order (e.g., 2nd order and higher) is used. The frequency drift estimation module 606 is also configured to create a history of the slopes and average these slopes (Eq. 11). The frequency error correction module 602 is configured to compensate for the short-term drift of the burst based on an average of the slopes (Eq. 12). Preferably, a user is ultimately provided a data stream based on the burst or the subsequent burst, and the data stream is viewed using the display 608. As will be appreciated by those having ordinary skill in the art, the present disclosure applies not only to DTV signals transmitted to a mobile device, but to receivers that receive a time sliced signal in general. The compensations for short-term drift and long-term drift can be performed along or in combination.

Other conditions and combinations of conditions will become apparent to those skilled in the art, including the combination of the conditions described above, and all such conditions and combinations are within the scope of the present disclosure.

Figure 7:
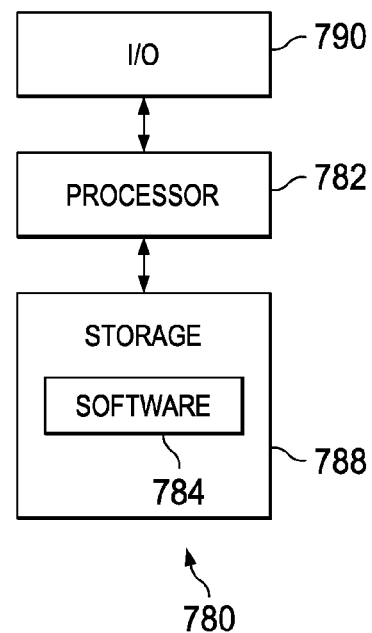
FIG. 7 illustrates a general-purpose computer suitable for implementing one or more embodiments described herein.

The system described above may be implemented on any general-purpose computer with sufficient processing power, memory resources, and throughput capability to handle the necessary workload placed upon the computer. FIG. 7 illustrates a typical, general-purpose computer system 780 suitable for implementing one or more embodiments disclosed herein. The computer system 780 includes a processor 782 (which may be referred to as a central processor unit or CPU) that is in communication with memory devices including storage 788, and input/output (I/O) 790 devices. The processor may be implemented as one or more CPU chips.

In various embodiments, the storage 788 comprises a computer-readable medium such as volatile memory (e.g., RAM), non-volatile storage (e.g., Flash memory, hard disk drive, CD ROM, etc.), or combinations thereof. The storage 788 comprises software 784 that is executed by the processor 782. One or more of the actions described herein are performed by the processor 782 during execution of the software 784.

The above disclosure is meant to be illustrative of the principles and various embodiment of the present invention. Numerous variations and modifications will become apparent to those skilled in the art once the above disclosure is fully appreciated. For example, the drift on signals other than DTV signals may be compensated for, any order of regression analysis may be implemented, and other techniques such as using a weighted average slope can be used. Also, the order of the actions shown in FIGS. 3 and 4 can be varied from order shown, and two or more of the actions may be performed concurrently. It is intended that the following claims be interpreted to embrace all variations and modifications.

What is claimed is:

1. A system, comprising:
   a frequency offset computation module;
   a frequency drift estimation module coupled to the frequency offset computation module; and
   a frequency error correction module coupled to the frequency offset computation module and the frequency drift estimation module;
   wherein the frequency offset computation module is configured to create a plurality of samples for each burst out of a plurality of bursts; and
   determine a plurality of frequency offsets for the plurality of samples, one frequency offset in the plurality of frequency offsets for each sample in the plurality of samples;
   wherein the frequency drift estimation module is configured to determine an intercept of the frequency drift based on the plurality of samples and the plurality of frequency offsets corresponding to at most one burst; and
   wherein the frequency error correction module is configured to compensate for long-term drift of a subsequent burst based on the intercept.

2. The system of claim 1,
   wherein the frequency offset computation module is further configured to:
   receive the plurality of bursts from the frequency error correction module; and
   forward the plurality of samples and the plurality of frequency offsets to the frequency drift estimation module; and
   wherein the frequency drift estimation module is further configured to receive the plurality of samples and the plurality of frequency offsets from the frequency offset computation module.

3. The system of claim 1, wherein, in determining the intercept, the frequency drift estimation module is configured to:
   determine a product of a slope of the frequency drift and a sum of the plurality of samples;
   determine a difference of a sum of the plurality of frequency offsets and the product; and
   divide the difference by the number of samples in the plurality of samples.

4. The system of claim 1, wherein, in compensating for the long-term drift, the frequency error correction module is configured to:
   determine a difference of a plurality of frequency offsets of the subsequent burst and the intercept.

5. The system of claim 1, wherein, in compensating for the long-term drift, the frequency error correction module is configured to compensate for the long-term drift of a plurality of subsequent bursts.

6. The system of claim 1,
   wherein the frequency drift estimation module is further configured to determine a slope of the frequency drift based on the plurality of samples and the plurality of frequency offsets; and
   wherein the frequency error correction module is further configured to compensate for short-term drift of the subsequent burst based on the slope.

7. The system of claim 6, wherein, in determining the slope, the frequency drift estimation module is configured to determine the slope of the frequency drift based on regression analysis.

8. The system of claim 6, wherein, in determining the slope, the frequency drift estimation module is configured to determine the slope of the frequency drift based on linear regression analysis.

9. The system of claim 6, wherein, in compensating for the short-term drift, the frequency error correction module is configured to compensate for the short-term drift based on the equation $e_{j+1}=[d_1^{j+1}-b'_j, d_2^{j+1}-2b'_j, \ldots, d_M^{j+1}-Mb'_j]$.

10. The system of claim 6,
    wherein, in determining the slope, the frequency drift estimation module is configured to determine an average slope of the frequency drift; and
    wherein, in compensating for the short-term drift, the frequency error correction module is configured to compensate for the short-term drift of the one burst out of the plurality of bursts based on the average slope.

11. The system of claim 10, wherein, in determining the average slope, the frequency drift estimation module is configured to:
    determine a plurality of slopes based on linear regression analysis, each slope in the plurality of slopes based on a separate burst out of the plurality of bursts;
    and
    average the plurality of slopes.

12. The system of claim 1, wherein the plurality of bursts of data comprise a digital television signal, and the system comprises a mobile device.

13. The system of claim 1, wherein the system provides a user a data stream based at least in part on the subsequent burst.

14. A computer-readable medium storing a software program that, when executed by a processor, causes the processor to:
    determine an intercept of frequency drift of a burst of data out of a plurality of bursts of data based on at most the burst, the frequency drift comprising long-term drift and short-term drift; and
    compensate for the long-term drift of a subsequent burst out of the plurality of bursts based on the intercept.

15. The computer-readable medium of claim 14, wherein compensating for the long-term drift causes the processor to:
    create a plurality of samples of the subsequent burst;
    determine a plurality of frequency offsets for the plurality of samples, one frequency offset in the plurality of frequency offsets for each sample in the plurality of samples; and
    determine a difference of the plurality of frequency offsets and the intercept.

16. The computer-readable medium of claim 14, further causing the processor to:
    determine an average slope of the frequency drift; and
    compensate for the short-term drift of the burst based on the average slope of the frequency drift.

17. The computer-readable medium of claim 16, wherein determining the average slope causes the processor to:
    determine a plurality of slopes based on linear regression analysis, each slope in the plurality of slopes based on a separate burst out of the plurality of bursts;
    and
    average the plurality of slopes.

18. A method, comprising:
    determining an intercept of frequency drift of a burst of data out of a plurality of bursts of data based on at most the burst, the frequency drift comprising long-term drift and short-term drift; and
    compensating for the long-term drift of a subsequent burst out of the plurality of bursts based on the intercept.

19. The method of claim 18, wherein compensating for the long-term drift comprises:
    creating a plurality of samples of the subsequent burst;
    determining a plurality of frequency offsets for the plurality of samples, one frequency offset in the plurality of frequency offsets for each sample in the plurality of samples; and
    determining a difference of the plurality of frequency offsets and the intercept.

20. The method of claim 18, further comprising:
    determining an average slope of the frequency drift; and
    compensating for the short-term drift of the burst based on the average slope of the frequency drift.

21. A system, comprising:
    a frequency offset computation module;
    a frequency drift estimation module coupled to the frequency offset computation module; and
    a frequency error correction module coupled to the frequency offset computation module and the frequency drift estimation module;
    wherein the frequency offset computation module is configured to create a plurality of samples for each burst out of a plurality of bursts; and
    determine a plurality of frequency offsets for the plurality of samples, one frequency offset in the plurality of frequency offsets for each sample in the plurality of samples;
    wherein the frequency drift estimation module is configured to determine a slope of the frequency drift based on the plurality of samples and the plurality of frequency offsets; and
    wherein the frequency error correction module is configured to compensate for short-term drift of a subsequent burst based on the slope.

22. The system of claim 21, wherein, in determining the slope, the frequency drift estimation module is configured to determine the slope of the frequency drift based on regression analysis.

23. The system of claim 21, wherein, in compensating for the short-term drift, the frequency error correction module is configured to compensate for the short-term drift based on the equation $e_{j+1}=[d_1^{j+1}-b'_j, d_2^{j+1}-2b'_j, \ldots, d_M^{j+1}-Mb'_j]$.

24. The system of claim 21,
    wherein, in determining the slope, the frequency drift estimation module is configured to determine an average slope of the frequency drift; and wherein, in compensating for the short-term drift, the frequency error correction module is configured to compensate for the short-term drift of the one burst out of the plurality of bursts based on the average slope.

25. The system of claim 24, wherein, in determining the average slope, the frequency drift estimation module is configured to:

determine a plurality of slopes based on linear regression analysis, each slope in the plurality of slopes based on a separate burst out of the plurality of bursts; and average the plurality of slopes.

* * * * *